United States Patent
Liao

(10) Patent No.: US 9,735,215 B2
(45) Date of Patent: Aug. 15, 2017

(54) PIXEL DEMARCATION LAYER, OLED AND MANUFACTURING METHOD THEREOF AS WELL AS DISPLAY DEVICE

(71) Applicant: BOE TECHNOLOGY GROUP CO., LTD., Beijing (CN)

(72) Inventor: Chinlung Liao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/098,893

(22) Filed: Apr. 14, 2016

(65) Prior Publication Data
US 2017/0033165 A1 Feb. 2, 2017

(30) Foreign Application Priority Data
Jul. 29, 2015 (CN) .......................... 2015 1 0456824

(51) Int. Cl.
*H01L 27/32* (2006.01)

(52) U.S. Cl.
CPC ...... *H01L 27/3246* (2013.01); *H01L 27/3211* (2013.01)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS

2009/0206733 A1* 8/2009 Hwang ............... H01L 51/5265
313/504

\* cited by examiner

*Primary Examiner* — Quoc Hoang
(74) *Attorney, Agent, or Firm* — Armstrong Teasdale LLP

(57) ABSTRACT

A pixel demarcation layer includes a first pixel demarcation sub-layer and a second pixel demarcation sub-layer stacked on the first pixel demarcation sub-layer. The pixel demarcation layer is divided into a display area and an edge area located outside the display area. The first pixel demarcation sub-layer includes a plurality of first openings positioned within the display area each corresponding to a light-emitting region of a respective sub-pixel unit. The second pixel demarcation sub-layer includes a plurality of second openings each coated with an organic light-emitting material. Each of the second openings includes a first area positioned in the display area and corresponding to a set of the first openings. Each of the second openings also includes a second area positioned in the edge area and configured to provide an initiating terminal from which the first area corresponding to the second area is coated with the organic light-emitting material.

10 Claims, 4 Drawing Sheets

PIXEL DEMARCATION LAYER, OLED AND MANUFACTURING METHOD THEREOF AS WELL AS DISPLAY DEVICE

CROSS REFERENCE TO RELATED APPLICATIONS

The present application claims priority to Chinese Patent Application Serial No. 201510456824.4, which was filed on Jul. 29, 2015, the disclosure of which is incorporated herein by reference in its entirety.

BACKGROUND

Exemplary embodiments of the present invention relate to a pixel demarcation layer, OLED and manufacturing method thereof as well as display device.

Due to its advantages such as, but not limited to, self-luminescence, all-solid state, wide viewing angle, and quick response time, it is considered that organic light emitting devices (OLED) have enormous potential in flat-panel display and are becoming a new generation of flat-panel display products after liquid crystal display (LCD) and plasma display panel (PDP).

An OLED mainly comprises an anode electrode layer, an organic light-emitting functional layer and a cathode electrode layer, among which the organic light-emitting functional layer is a core component of the OLED. Currently, there are two methods for fabricating the organic light-emitting functional layer, including vacuum evaporation and solution processing. As compared with the organic light-emitting functional layer fabricated by means of vacuum evaporation, the organic light-emitting functional layer fabricated by means of solution processing exhibits better coating performance for the anode electrode layer, resulting in an OLED with reduced leakage current. Moreover, adopting solution processing is conducive to whole surface coating of the substrate and thus enhances the OLED productivity. Strip coating is so far a potential coating technique for solution-processed OLED. However, since the coating device may be unstable at the beginning of the coating process, such coating technique easily leads to ink overflow at the initiating terminal for the coating process, and as a result, its application in display is limited.

BRIEF DESCRIPTION

Embodiments of the present disclosure facilitate overcoming the above-mentioned technical problem in the prior art, i.e., ink overflow at beginning of the coating process due to instability of the coating device.

In one aspect, there is provided a pixel demarcation layer that includes a first pixel demarcation sub-layer and a second pixel demarcation sub-layer stacked on the first pixel demarcation sub-layer. The pixel demarcation layer is divided into a display area and an edge area located outside the display area The first pixel demarcation sub-layer includes a plurality of first openings positioned within the display area. Each of the first openings corresponds to a light-emitting region of a respective sub-pixel unit. The second pixel demarcation sub-layer includes a plurality of second openings. Each of the subpixel openings is coated with an organic light-emitting material. Each of the second openings includes a first area positioned in the display area and corresponding to a set of the first openings. Each of the second openings further includes a second area positioned in the edge area and configured to provide an initiating terminal from which the first area corresponding to the second area is coated with the organic light-emitting material.

According to an embodiment, the plurality of first openings is arranged in columns, and each first area corresponds to one of the columns.

According to an embodiment, each second opening includes a plurality of first areas, and the first areas of each second opening are coupled in flow communication with each other via the corresponding second area.

According to an embodiment, two adjacent columns of the first openings are coated with different organic light-emitting materials.

In another aspect, there is provided an OLED that includes the pixel demarcation layer as described above.

In another aspect, there is provided a display device that includes the OLED as described above.

In another aspect, there is provided a method of manufacturing an LED. The method includes making, on a substrate, a pixel demarcation layer comprising a first pixel demarcation sub-layer and a second pixel demarcation sub-layer stacked on the first pixel demarcation sub-layer, wherein the pixel demarcation layer is divided into a display area and an edge area located outside the display area, the first pixel demarcation sub-layer includes a plurality of first openings positioned within the display area, wherein each of the first openings corresponds to a light-emitting region of a respective sub-pixel unit, the second pixel demarcation sub-layer includes a plurality of second openings, each of the second openings coated with an organic light-emitting material, each of the second openings includes (i) a first area positioned in the display area and corresponding to a set of the first openings, and (ii) a second area positioned in the edge area; and coating an organic light-emitting material on the first area corresponding to the second area using the second area as an initiating terminal, to form an organic light-emitting layer.

According to an embodiment, making the pixel demarcation layer further includes arranging the plurality of first openings in columns, and each first area corresponds to one of the columns.

According to an embodiment, each second opening includes a plurality of first areas, and making the pixel demarcation layer further includes coupling the first areas of each second opening in flow communication with each other via the second area corresponding to the first areas.

According to an embodiment, coating the organic light-emitting material includes coating two adjacent columns of the first openings with different organic light-emitting materials.

According to the embodiments of the pixel demarcation layer provided herein, the second opening of the second pixel demarcation sub-layer is additionally provided with a second area which extends to the edge area and serves as an initiating terminal from which the coating of the organic light-emitting material is performed, such that the ink excessively injected by the coating device, which may be unstable at the beginning of the coating process, can be stored in said second area, whereby the ink overflow phenomenon can be significantly alleviated.

BRIEF DESCRIPTION OF THE DRAWINGS

To illustrate the embodiments described herein more clearly, the accompanying drawings will be briefly described below. Obviously, the accompanying drawings in the following description are associated with example embodiments, and other embodiments may become apparent to those of ordinary skill in the art based on these drawings.

DETAILED DESCRIPTION OF THE PREFERRED EMBODIMENTS

To make the present disclosure clearer, the present disclosure will be clearly and comprehensively described below in conjunction with the accompanying drawings in the example embodiments. Obviously, the embodiments described are merely part instead of all of embodiments of the present disclosure. Based on the embodiments of the present disclosure as described herein, those of ordinary skill in the art may obtain other embodiments which also fall within the scope of protection of the present disclosure.

According to an embodiment of the present disclosure, there is provided a pixel demarcation layer comprising a first pixel demarcation sub-layer and a second pixel demarcation sub-layer stacked on the first pixel demarcation sub-layer, wherein the pixel demarcation layer may be divided into a display area and an edge area located outside the display area. The first pixel demarcation sub-layer includes a plurality of first openings within the display area, each of which corresponds to a light-emitting region of a respective sub-pixel unit. The second pixel demarcation sub-layer includes a plurality of second openings, each of which is coated with an organic light-emitting material. Each of the second openings at least includes a first area positioned in the display area and corresponding to a set of the first openings, and a second area positioned in the edge area and serving as an initiating terminal, from which the first area corresponding to the second area is coated with the organic light-emitting material.

According to the pixel demarcation layer provided by the embodiments of the present disclosure, the second area may store the ink excessively injected by the coating device which may be unstable at the beginning of the coating process, whereby the ink overflow phenomenon due to instability of the coating device may be effectively alleviated.

Figure 1:
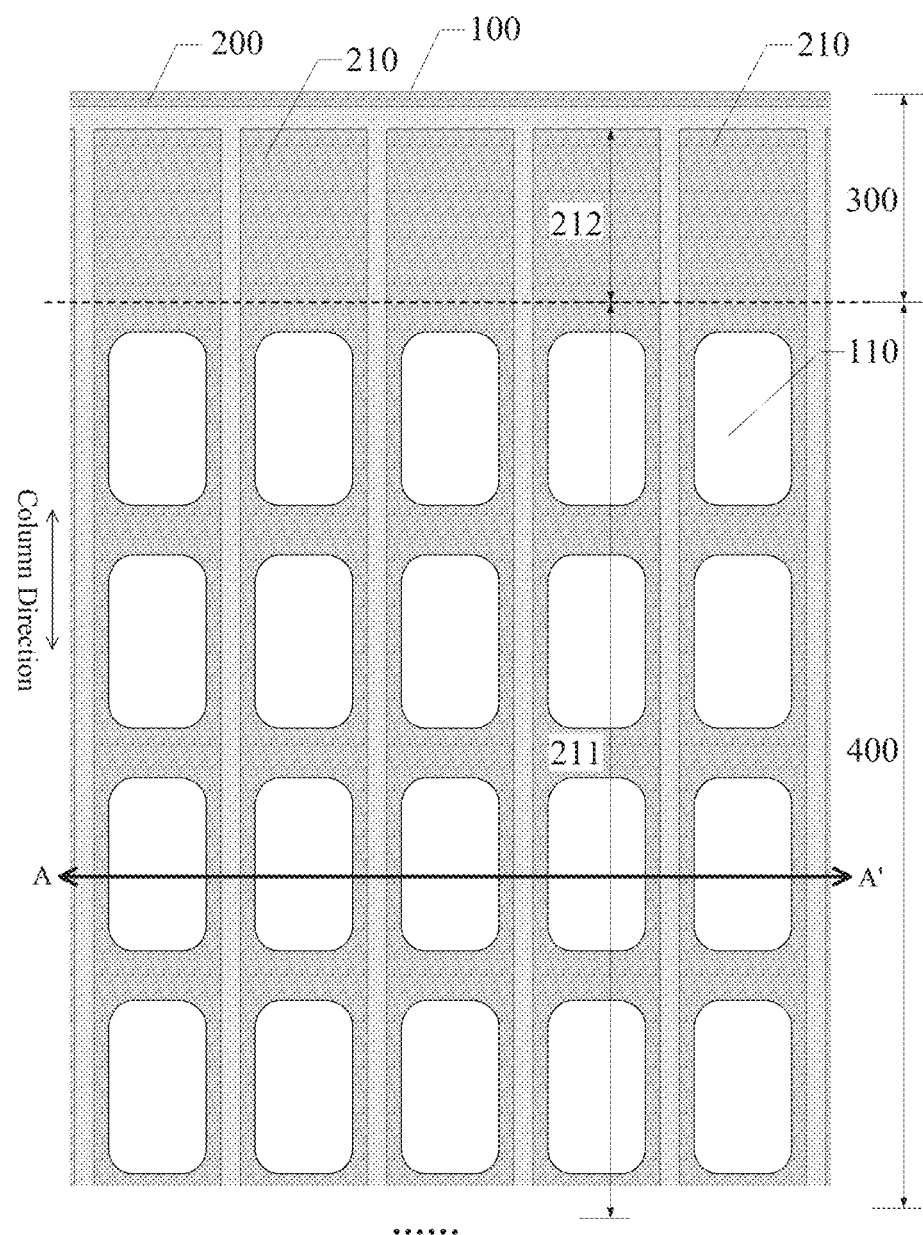
FIG. 1 is a schematic view illustrating the structure of a pixel demarcation layer according to an embodiment.
Figure 2:
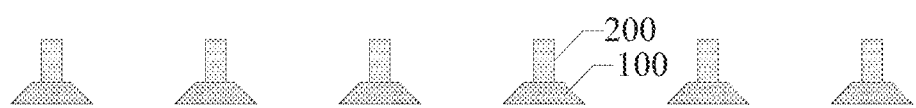
FIG. 2 is a schematic view illustrating the cross-section along the AA' direction shown in FIG. 1.

FIG. 1 is a schematic view illustrating the structure of a pixel demarcation layer according to an embodiment of the present disclosure, and FIG. 2 is a schematic view illustrating the cross-section along the AA' direction shown in FIG. 1. As can be seen, the pixel demarcation layer comprises a first pixel demarcation sub-layer 100 and a second pixel demarcation sub-layer 200 stacked on the first pixel demarcation sub-layer 100. The pixel demarcation layer is divided into a display area 400 and an edge area 300 located outside the display area.

The first pixel demarcation sub-layer 100 includes a plurality of first openings 110 positioned within the display area 400, each of which corresponds to a light-emitting region of a respective sub-pixel unit. The plurality of first openings 110 is distributed in the form of multiple columns, and the first openings in the same column are coated with the same organic light-emitting material.

The second pixel demarcation sub-layer 200 includes a plurality of second openings 210, each of which (e.g., the second opening 210 in each column) is coated with an organic light-emitting material. Each second opening 210 at least comprises a first area 211 positioned in the display area and corresponding to a column of the first openings, and a second area 212 arranged in the edge area. For each said second opening, its second area serves as an initiating terminal, from which the first area corresponding to the second area is coated with the organic light-emitting material, whereby the first openings in the corresponding column are coated.

More specifically, with respect to the pixel demarcation layer, the first openings in the first pixel demarcation sub-layer are coated with the organic light-emitting material in the form of columns, and the organic light-emitting material coated onto one column is prevented from flowing towards an adjacent column by the second pixel demarcation sub-layer.

Figure 3:
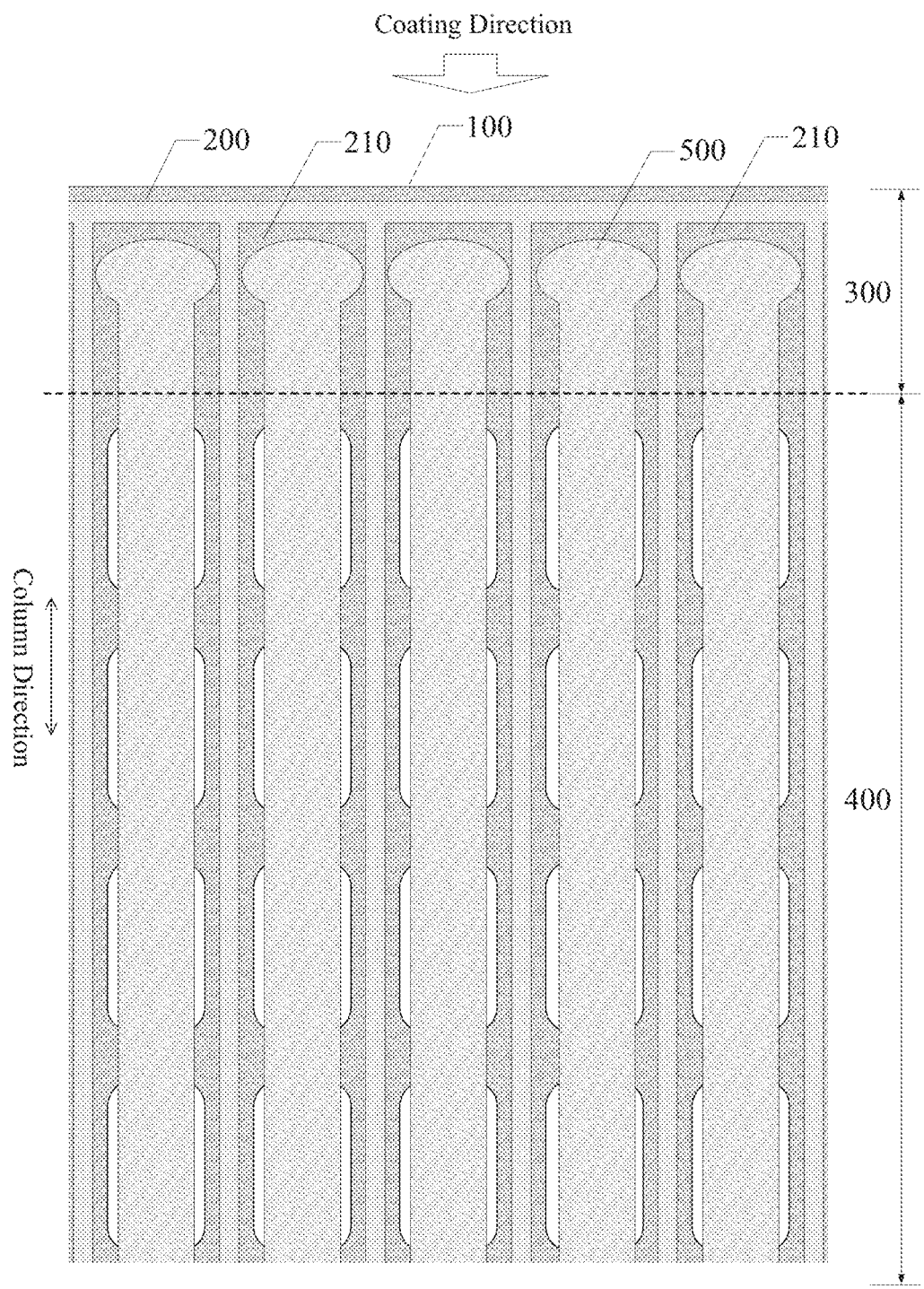
FIG. 3 is a schematic view illustrating the structure of the pixel demarcation layer shown in FIG. 1 coated with an organic light-emitting material.

As shown in FIG. 3, each column of the first openings in the first pixel demarcation sub-layer is coated with an organic light-emitting material 500 by using the second area in the second opening 210 as an initiating terminal. In this way, the ink excessively injected by the coating device, which may be unstable at the beginning of the coating process, can be stored in the second area, whereby the ink overflow phenomenon due to instability of the coating device can be effectively alleviated. Moreover, since the ink excessively injected can be stored in the second area, an environmental difference between the edge of the display area and the center of the display area can be reduced, whereby a difference in the ink evaporation speed between said edge and center is reduced, and the uniformity of the organic light-emitting functional layer is enhanced.

According to an embodiment of the present disclosure, each second opening in the second pixel demarcation sub-layer includes a plurality of first areas, and the first areas of the same second opening are in flow communication with each other via the second area corresponding to the first areas.

Figure 4:
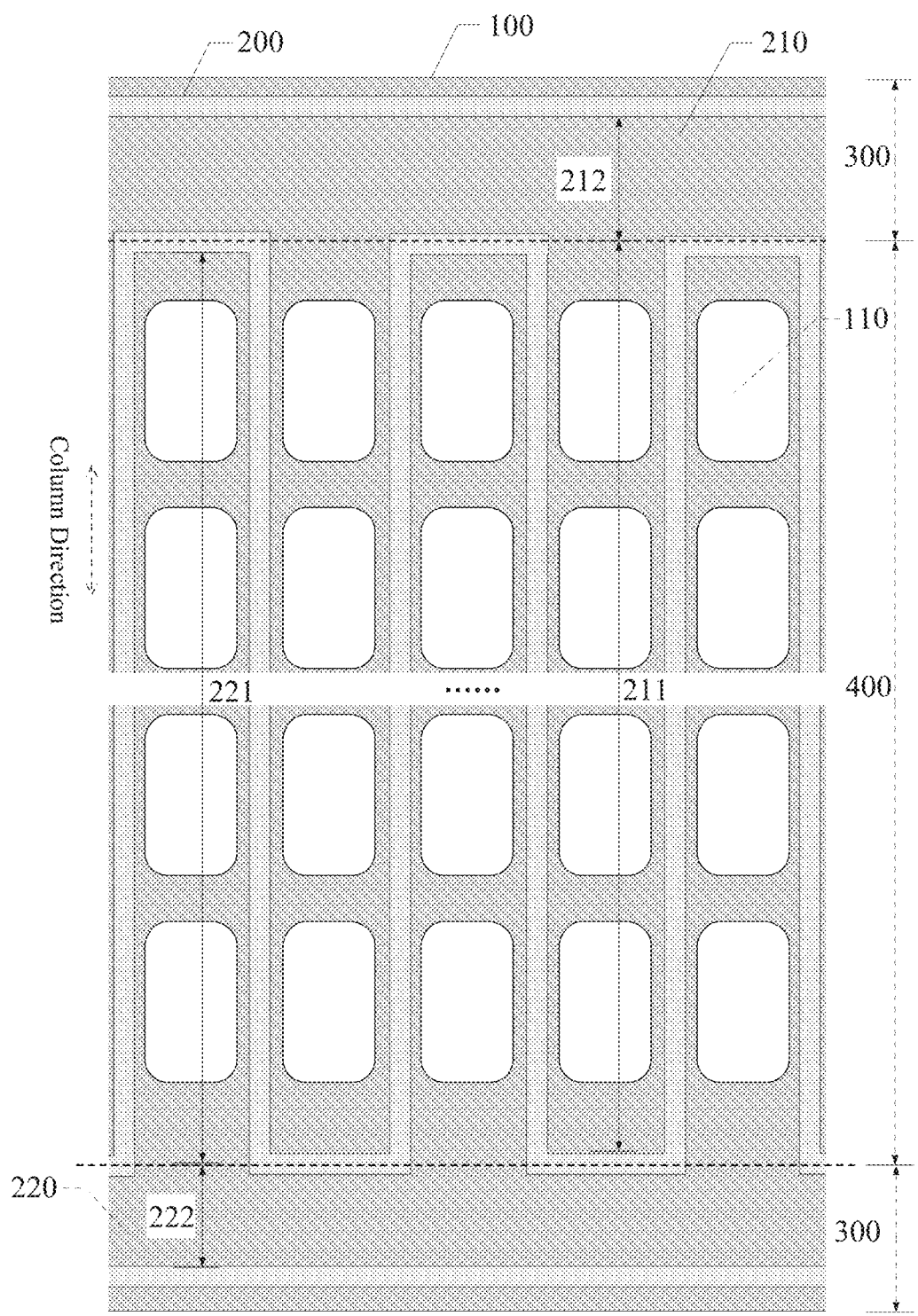
FIG. 4 is a schematic view illustrating the structure of a pixel demarcation layer according to another embodiment.

FIG. 4 is a schematic view illustrating the structure of a pixel demarcation layer according to another embodiment of the present disclosure. The pixel demarcation layer includes a first pixel demarcation sub-layer 100 and a second pixel demarcation sub-layer 200 stacked on the first pixel demarcation sub-layer 100. The pixel demarcation layer is divided into a display area 400 and an edge area 300 located outside the display area 400. The first pixel demarcation sub-layer 100 includes a plurality of first openings 110 positioned within the display area 400, each of which corresponds to a light-emitting region of a respective sub-pixel unit. The plurality of first openings 110 is arranged in multiple columns and the first openings in the same column are coated with the same organic light-emitting material. The second pixel demarcation sub-layer 200 includes two second openings 210, 220, each of which is coated with an organic light-emitting material. In this case, each of the second openings includes a plurality of first areas and a second area. For example, the second opening 210 comprises a plurality of first areas 211 (which, for example, correspond to the second and fourth columns of the first openings) and a second area 212, and the second opening 220 comprises a plurality of first areas 221 (which, for example, correspond to the first, third and fifth columns of the first openings) and a second area 222. In each of the second openings, each of the first areas 211, 221 corresponds to a column of the first openings in the first pixel demarcation sub-layer.

According to an embodiment of the present disclosure, the two second openings 210, 220 are coated with different organic light-emitting materials.

For example, according to the pixel demarcation layer described above, since two adjacent columns of the first openings correspond to different second openings, it is possible to coat the two adjacent columns of the first openings with different organic light-emitting materials.

According to an embodiment of the present disclosure, the same organic light-emitting material refers to those configured to emit light with the same color, and the different organic light-emitting materials refer to those configured to emit light of different colors.

When the pixel demarcation layer is coated with organic light-emitting materials, since each second opening includes a plurality of first areas and a second area, multiple columns of the first openings share one second area as an initiating terminal for coating. As a result, the area of each second area can be effectively increased to increase its ink storage capacity, whereby the ink overflow phenomenon can be further alleviated and the difference in the ink evaporation speed between the edge and the center can be further reduced.

Figure 5:
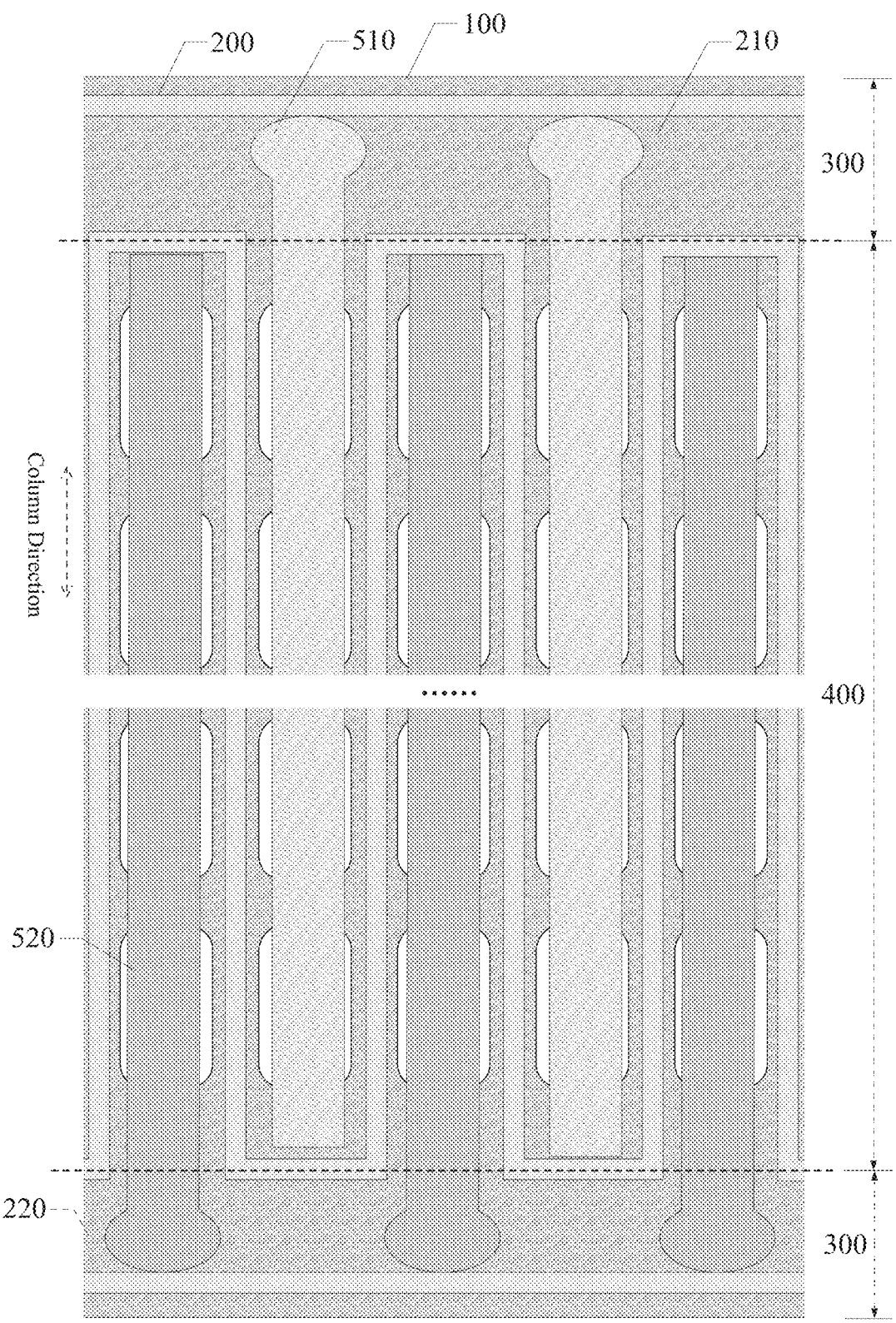
FIG. 5 is a schematic view illustrating the structure of the pixel demarcation layer shown in FIG. 4 coated with an organic light-emitting material.

As shown in FIG. 5, for example, in order to coat the pixel demarcation layer as shown in FIG. 4 with two different organic light-emitting functional layers 510, 520, the second area 212 is used as an initiating terminal for forming the organic light-emitting functional layer 510 and the second area 222 is used as an initiating terminal for forming the organic light-emitting functional layer 520. By means of the second areas 212, 222, it is possible to effectively alleviate the ink overflow phenomenon which may occur at the beginning of the coating process due to instability of the coating device, and reduce the difference in the ink evaporation speed between the edge and the center, thus enhancing uniformity of the organic light-emitting functional layer.

According to an embodiment of the present disclosure, there is further provided an OLED that includes the pixel demarcation layer as described above.

According to an embodiment of the present disclosure, there is further provided a display device that includes the OLED as described above.

The display device provided according to embodiments of the present disclosure may be a laptop screen, display, TV, digital photo frame, mobile phone, tablet or any product or component with a display function.

According to an embodiment of the present invention, there is further provided a method of manufacturing an OLED that includes the following steps, designated as step S1 and step S2:

The step S1 includes making a pixel demarcation layer on a substrate. The pixel demarcation layer includes a first pixel demarcation sub-layer and a second pixel demarcation sub-layer stacked on the first pixel demarcation sub-layer, wherein the pixel demarcation layer is divided into a display area and an edge area located outside the display area. The first pixel demarcation sub-layer includes a plurality of first openings positioned within the display area, each of which corresponds to a light-emitting region of a respective sub-pixel unit. The second pixel demarcation sub-layer includes a plurality of second openings. Each of the second openings is coated with an organic light-emitting material and at least includes (i) a first area arranged in the display area and corresponding to a plurality of the first openings, and (ii) a second area positioned in the edge area.

The step S2 includes coating an organic light-emitting material on the first area corresponding to the second area, using the second area as an initiating terminal, to form an organic light-emitting layer.

According to an embodiment of the present disclosure, making the pixel demarcation layer in step S1 further includes arranging the plurality of first openings in columns, and each said first area corresponds to one of the columns of the first openings.

According to an embodiment of the present invention, each second opening includes a plurality of first areas, and making the pixel demarcation layer in step S1 further includes coupling the first areas of each second opening in flow communication with each other via the second area corresponding to the first areas.

According to an embodiment of the present disclosure, coating the organic light-emitting material in step S2 includes coating two adjacent columns of the first openings with different organic light-emitting materials.

Those skilled in the art would appreciate that all or a part of the steps in the foregoing embodiments may be implemented by hardware or by a program instructing relevant hardware. The program may be stored in a computer readable storage medium, such as a ROM, a magnetic disk, or an optical disk etc.

The foregoing is only example embodiments of the present disclosure and is not intended to limit the present disclosure. All modifications, equivalent substitutions and improvements, which fall within the spirit and principles of the present disclosure, are intended to be included in the scope of protection of the present disclosure.

What is claimed is:

1. A pixel demarcation layer, comprising a first pixel demarcation sub-layer and a second pixel demarcation sub-layer stacked on the first pixel demarcation sub-layer, wherein the pixel demarcation layer is divided into a display area and an edge area located outside the display area, the first pixel demarcation sub-layer includes a plurality of first openings positioned within the display area, wherein each of the first openings corresponds to a light-emitting region of a respective sub-pixel unit, the second pixel demarcation sub-layer includes a plurality of second openings, each of the second openings coated with an organic light-emitting material, each of the second openings includes:
 a first area positioned in the display area and corresponding to a set of the first openings; and
 a second area positioned in the edge area and configured to provide an initiating terminal from which the first area corresponding to the second area is coated with the organic light-emitting material.

2. The pixel demarcation layer according to claim 1, wherein the plurality of first openings is arranged in columns, each first area corresponds to one of the columns.

3. The pixel demarcation layer according to claim 2, wherein each second opening comprises a plurality of first areas, the first areas of each second opening coupled in flow communication with each other via the corresponding second area.

4. The pixel demarcation layer according to claim 3, wherein two adjacent columns of the first openings are coated with different organic light-emitting materials.

5. An OLED, comprising the pixel demarcation layer according to claim 1.

6. A display device, comprising the OLED according to claim 5.

7. A method of manufacturing an LED, the method comprising:

making, on a substrate, a pixel demarcation layer comprising a first pixel demarcation sub-layer and a second pixel demarcation sub-layer stacked on the first pixel demarcation sub-layer, wherein the pixel demarcation layer is divided into a display area and an edge area located outside the display area, the first pixel demarcation sub-layer includes a plurality of first openings positioned within the display area, wherein each of the first openings corresponds to a light-emitting region of a respective sub-pixel unit, the second pixel demarcation sub-layer includes a plurality of second openings, each of the second openings coated with an organic light-emitting material, each of the second openings includes (i) a first area positioned in the display area and corresponding to a set of the first openings, and (ii) a second area positioned in the edge area; and coating an organic light-emitting material on the first area corresponding to the second area using the second area as an initiating terminal, to form an organic light-emitting layer.

8. The method of manufacturing an LED according to claim 7, wherein making the pixel demarcation layer further comprises arranging the plurality of first openings in columns, wherein each first area corresponds to one of the columns.

9. The method of manufacturing an LED according to claim 8, wherein each second opening comprises a plurality of first areas, and wherein making the pixel demarcation layer further comprises coupling the first areas of each second opening in flow communication with each other via the second area corresponding to the first areas.

10. The manufacturing method of an LED according to claim 9, wherein coating the organic light-emitting material comprises coating two adjacent columns of the first openings with different organic light-emitting materials.

* * * * *